(12) United States Patent
Jain et al.

(10) Patent No.: US 7,793,037 B2
(45) Date of Patent: Sep. 7, 2010

(54) PARTIAL PAGE SCHEME FOR MEMORY TECHNOLOGIES

(75) Inventors: Sandeep Jain, Milpitas, CA (US); Animesh Mishra, Pleasanton, CA (US); Jim Kardach, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 196 days.

(21) Appl. No.: 11/140,772

(22) Filed: May 31, 2005

(65) Prior Publication Data

US 2006/0271748 A1 Nov. 30, 2006

(51) Int. Cl.
*G06F 12/00* (2006.01)
(52) U.S. Cl. ........................ 711/104; 711/105
(58) Field of Classification Search ........................ None
See application file for complete search history.

(56) References Cited

U.S. PATENT DOCUMENTS

| | | | |
|---|---|---|---|
| 5,265,220 A * | 11/1993 | Kinoshita | 711/205 |
| 6,181,633 B1 | 1/2001 | Shimakawa et al. | |
| 6,453,433 B1 * | 9/2002 | Vollrath | 714/718 |
| 6,694,422 B1 | 2/2004 | Kim | |
| 6,868,034 B2 | 3/2005 | La et al. | |
| 2001/0049767 A1 * | 12/2001 | Park et al. | 711/104 |
| 2003/0112675 A1 * | 6/2003 | Mukai et al. | 365/200 |
| 2004/1095835 | 5/2004 | La et al. | |
| 2006/0004996 A1 * | 1/2006 | Gonion | 712/241 |
| 2006/0107019 A1 * | 5/2006 | Ganfield et al. | 711/202 |
| 2006/0248305 A1 * | 11/2006 | Fang et al. | 711/167 |

\* cited by examiner

*Primary Examiner*—Mardochee Chery
(74) *Attorney, Agent, or Firm*—Blakely, Sokoloff, Taylor & Zafman LLP

(57) ABSTRACT

Systems and methods of managing memory provide for detecting a request to activate a memory portion that is limited in size to a partial page size, where the partial page size is less than a full page size associated with the memory. In one embodiment, detecting the request may include identifying a row address and partial page address associated with the request, where the partial page address indicates that the memory portion is to be limited to the partial page size.

24 Claims, 8 Drawing Sheets

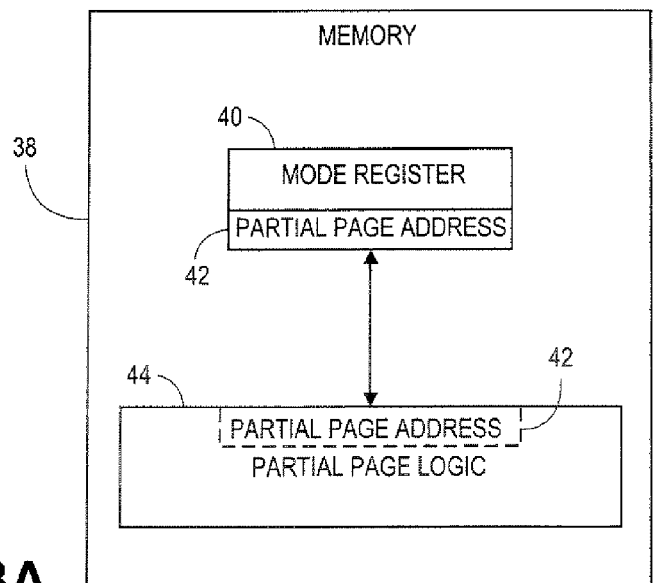
FIG. 3A
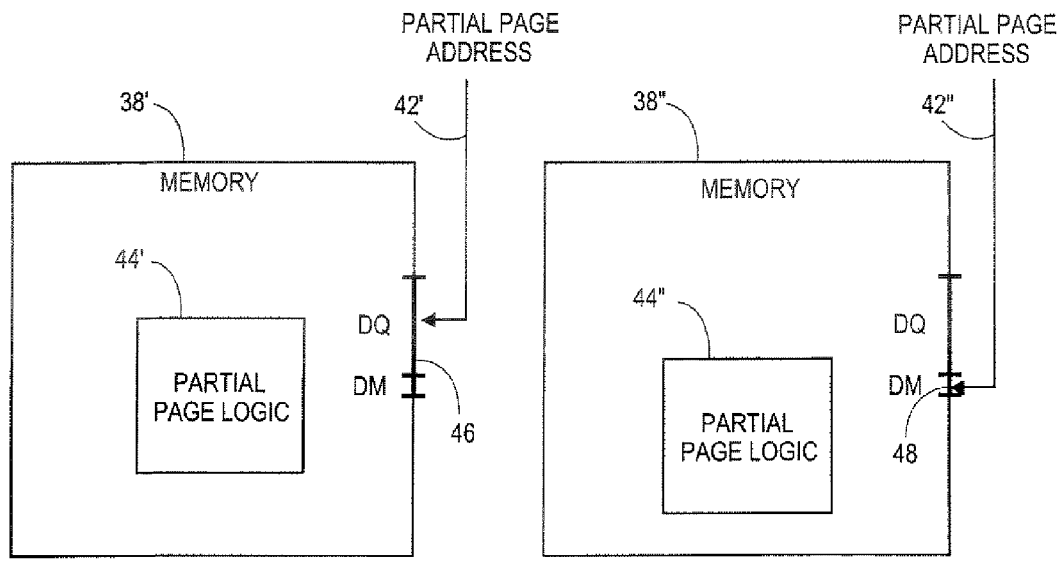
FIG. 3B  FIG. 3C

US 7,793,037 B2

PARTIAL PAGE SCHEME FOR MEMORY TECHNOLOGIES

BACKGROUND

1. Technical Field

Some embodiments of the present invention generally relate to memory technologies. In particular, certain embodiments relate to the activation of partial pages in memory.

2. Discussion

The popularity of computing systems continues to grow and the demand for more computing functionality has reached new heights. With this demand has come a number of concerns regarding memory structures. For example, although the development of double data rate (e.g., DDR Synchronous Dynamic Random Access Memory/SDRAM Specification, JESD79D, JEDEC Solid State Technology Association, January 2004; DDR2 SDRAM Specification, JESD79-2A, JEDEC Solid State Technology Association, January 2004, etc.) memory technologies has increased the rate at which data can be written to and read from DRAM, difficulties with power consumption often remain.

In particular, activating a bank of memory can be a power intensive operation due to page size. Page size typically refers to the minimum number of column locations that are on any row and are accessed with a single ACTIVATE command, where each time an ACTIVATE command is issued, all the bits within the page are often read by an array of sense amplifiers and restored to their correct value. In a DRAM, to meet various system requirements across desktop, mobile and server systems, DDR technologists have adopted a standard page size definition. For example for a 512 Mb x16 device configuration, the page size has been defined as 2 KB. When a memory controller activates a bank by supplying a row address (A0-A12 for the 512 Mb DRAM example), a row equivalent to a page size of 2 KB can be loaded into the sense amp array. This 2 KB page size equates to 16,384 bits. Out of these bits only 16 bits are typically transferred out at each clock edge. Due to the burst mode nature of DDR technology, 128 bits could therefore be accessed in 4 clocks. Accordingly, this scheme of activating all 16,384 bits may not be well suited for applications that are not fetching a complete 2 KB from (or writing a complete 2 KB to) each DRAM device. Thus, for certain applications, activating a full page size could be a wasteful activity.

BRIEF DESCRIPTION OF THE DRAWINGS

The various advantages of the embodiments of the present invention will become apparent to one skilled in the art by reading the following specification and appended claims, and by referencing the following drawings, in which:

FIGS. 3A-3C are block diagrams of examples of partial page addressing techniques according to one or more embodiments of the invention;

DETAILED DESCRIPTION

In the following description, for purposes of explanation, numerous specific details are set forth in order to provide a thorough understanding of the embodiments of the present invention. It will be evident, however, to one skilled in the art that the embodiments of the present invention may be practiced without these specific details. In other instances, specific apparatus structures and methods have not been described so as not to obscure the embodiments of the present invention. The following description and drawings are illustrative of the embodiments of the invention and are not to be construed as limiting the embodiments of the invention.

Some portions of the detailed description, which follow, may be presented in terms of algorithms and symbolic representations of operations on data bits or binary digital signals within a computer memory. These algorithmic descriptions and representations may be the techniques used by those skilled in the data processing arts to convey the substance of their work to others skilled in the art. For example, certain logic described herein may be implemented using hardware techniques such as complementary metal oxide semiconductor (CMOS) technology, controller firmware, microcode, software techniques, and any combination thereof. Additionally, the use of terms such as "request", "command", etc., are not limiting in the sense that a response may be required from the component receiving the request and/or command. Thus, such terms may be deemed as interchangeable for the purposes of this discussion. Furthermore, any use of the terms "first", "second", etc. does not necessarily infer a chronological relationship, and is used to facilitate discussion only.

Unless specifically stated otherwise, as apparent from the following discussions, it is appreciated that throughout the specification, discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Figure 1:
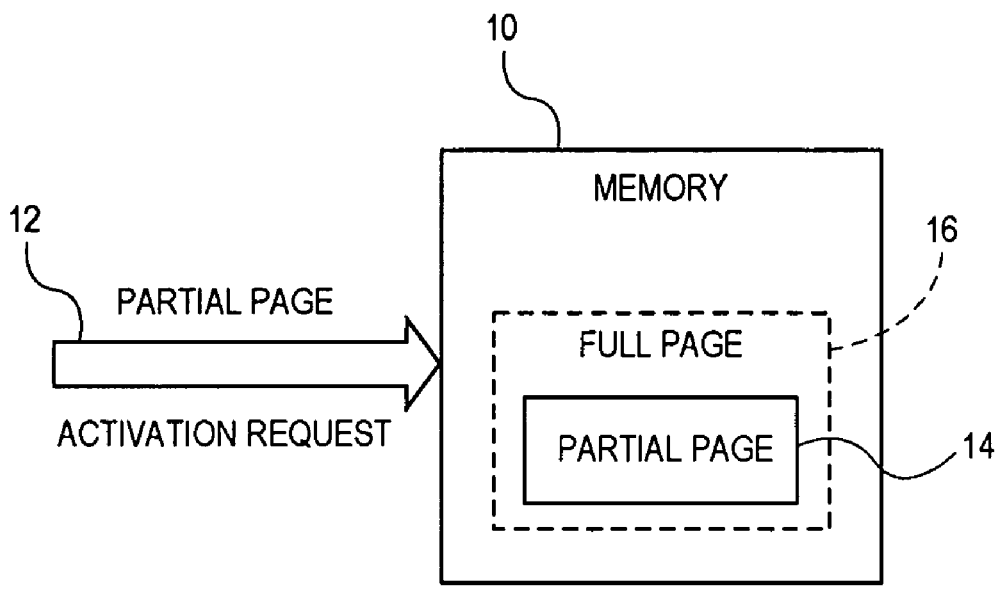
FIG. 1 is a block diagram of an example of a memory portion having a partial page size according to one embodiment of the invention.

FIG. 1 shows a memory 10 such as a double data rate (DDRx) dynamic random access memory (DRAM), where the memory 10 is configured to receive a partial page activation request/command 12. The activation request 12 could be associated with a read or write transaction. Upon detecting the request 12, the memory 10 is able to activate a memory portion 14 that is limited in size to a partial page size, where the partial page size is less than a full page size 16 associated with the memory 10. By limiting activation to the partial page size, the illustrated memory 10 is able to significantly reduce power consumption. For example, if the memory 10 has a 512 Mb x16 device configuration, the full page size 16 might be 2 KB (i.e., 16,384 bits). For certain applications, however, a memory controller might expect only eight cache line accesses from a page. Thus, at 64 bits per cache line, a contiguous block of only 512 bits may be needed rather than the full 16,384 bits. In the illustrated example, the full page size 16 of 2 KB could be divided into 32 partial-/sub-pages having a page size of 512 bits, where only the appropriate sub-page is activated. The power consumption associated with activating the entire page can therefore be avoided. As will be discussed in greater detail, the activation request 12 would simply need to supply five extra bits (i.e., $2^5=32$) in order to specify a sub-page address under the example provided.

Although a number of the examples described herein may refer to specific full/partial page sizes and memory technologies (e.g., DDRx SDRAM), the embodiments of the invention are not so limited. Indeed, many of the principles described herein may be advantageous for any page size and for any memory structure in which power consumption is an issue of concern. Notwithstanding, there are a number of aspects of high density DDRx SDRAM structures for which the embodiments are well suited.

Figure 2A:
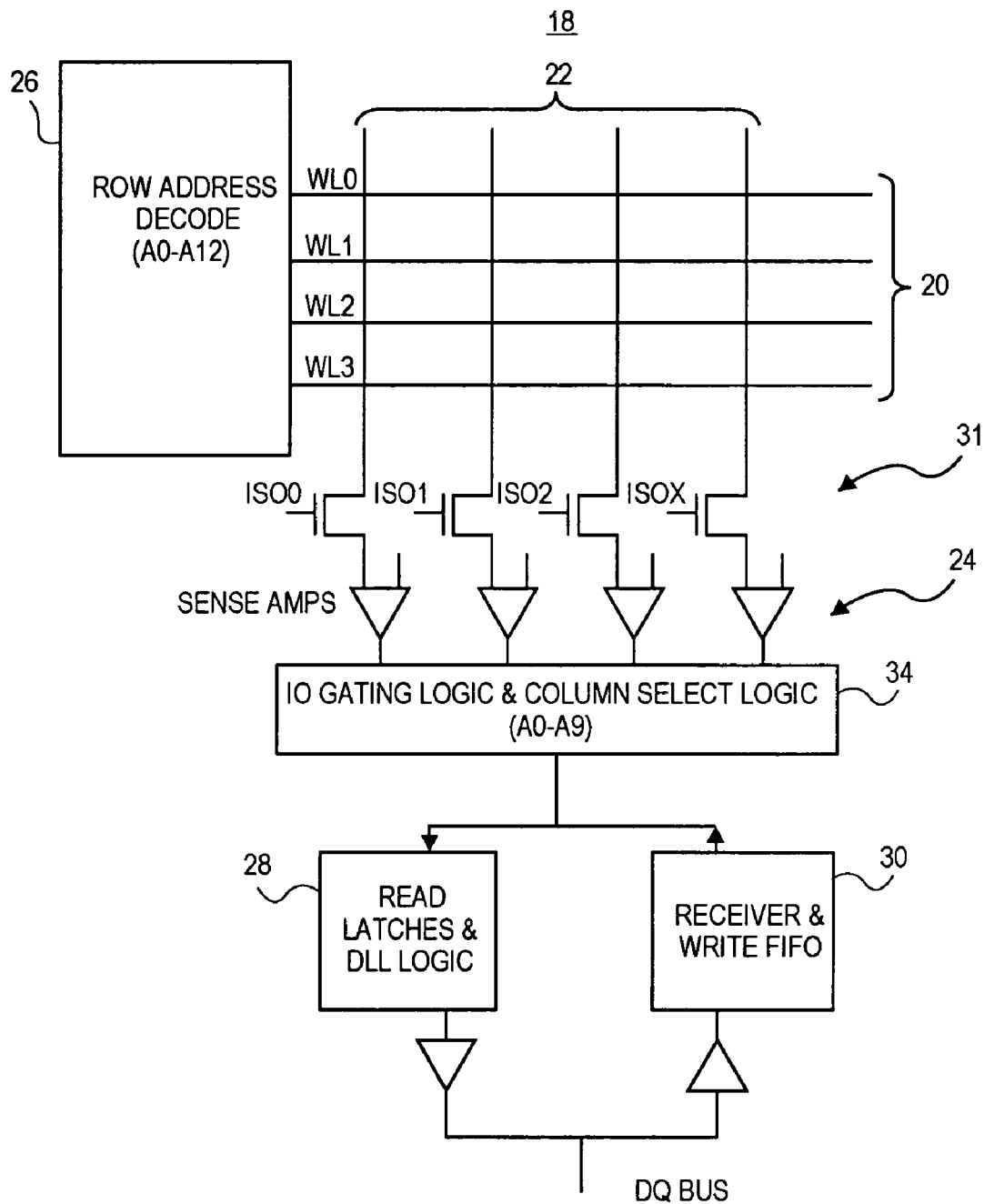
FIGS. 2A and 2B are block diagrams of examples of partial page activation techniques according to one or more embodiments of the invention.

Turning now to FIG. 2A, one approach to activating partial pages is shown. In the illustrated example, a memory 18 includes a bank having a plurality of rows 20, a plurality of columns 22 and a plurality of sense amplifiers 24 corresponding to the plurality of columns 22. The memory 18 may also have a row address decoder 26, read logic 28, write logic 30, input output (IO) gating and column select logic 34 and a plurality of isolation switches 31 corresponding to the plurality of sense amplifiers 24 and columns 22. Each isolation switch 31 can be coupled to a corresponding column 22 and sense amplifier 24, where the isolation switches 31 may be used to isolate one or more of the sense amplifiers 24 from the columns 22 to provide for activation of only a partial page. In the illustrated example, the isolation switches 31 are transistors that can be selectively enabled/disabled to ensure that only a subset of the full number of columns in the activated row is loaded into the sense amplifiers 24. As a result, the power consumption of the sense amplifiers 24, the IO gating and column select logic 34, read logic 28 and write logic 30 can be reduced in accordance with the isolated columns.

Figure 2B:
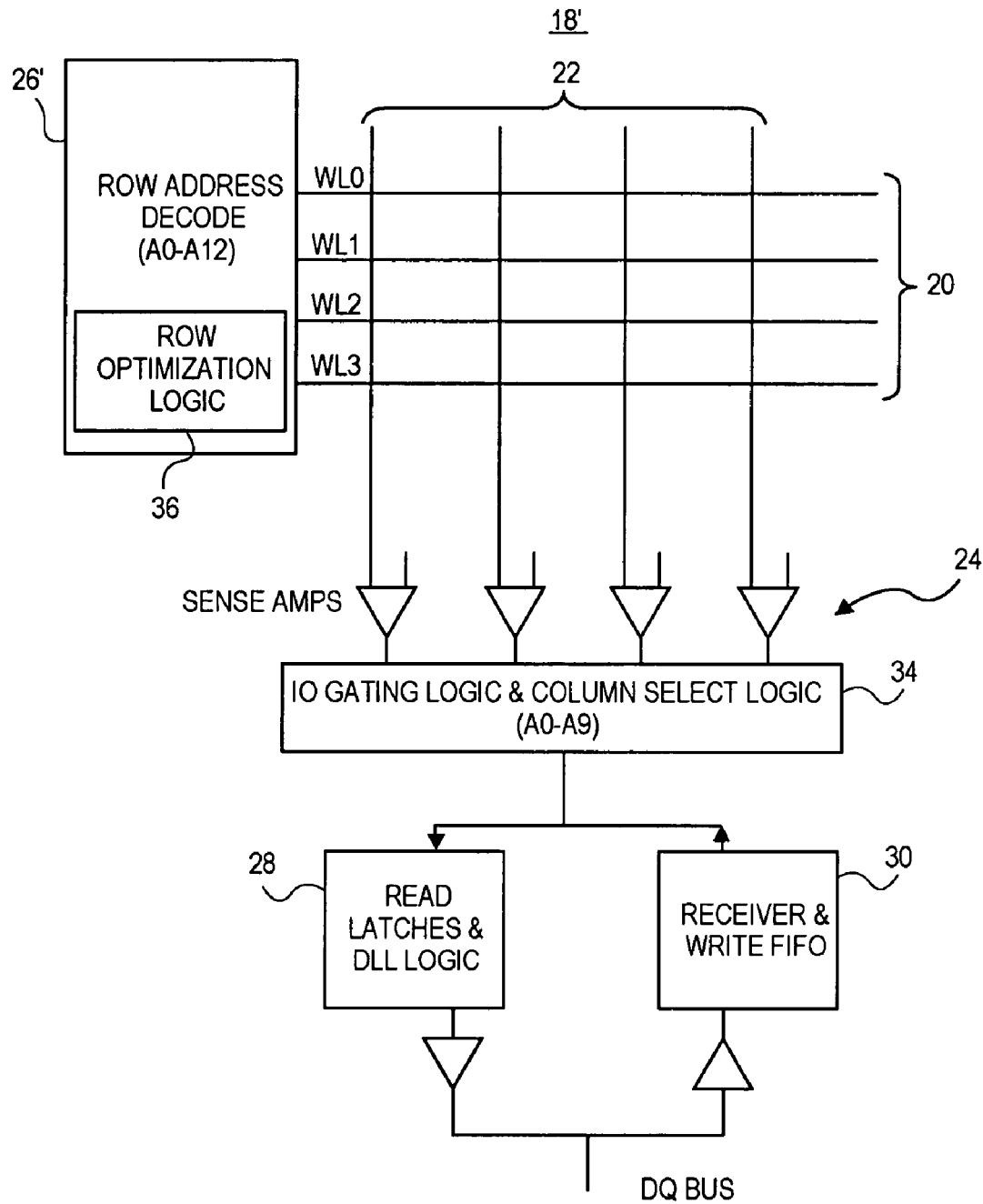

FIG. 2B shows an alternative approach to activating partial pages in a memory 18'. In particular, the illustrated memory 18' has a modified row address decoder 26' that includes row optimization logic 36. The row optimization logic 36 may provide for partial page activation by excluding one or more of the columns 22 of the activated row from activation based on the activation request. The resulting subset of activated columns can correspond to the desired partial page size.

Turning now to FIG. 3A, one approach to identifying partial page activation requests is shown in a memory 38. Generally, the memory 38 is able to identify a row address and a partial page address associated with the activation request, where the partial page address indicates that the activated memory portion is to be limited to the partial page size. Thus, if no partial page address is associated with the activation request, the memory 38 may simply activate a full page. In particular, the memory 38 can include a mode register 40 capable of storing the partial page address 42. The mode register 40 can be part of one or more internal configuration registers that allow the functionality of the memory 38 to be specified. In one embodiment, the mode register 40 can be set externally. The memory 38 can also include partial page logic 44 to retrieve the partial page address 42 from the mode register 40, where the partial page address 42 is used to determine which columns on the activated row should be loaded into the sense amplifiers.

FIG. 3B shows an alternative approach to identifying partial page addresses in which a memory 38' uses partial page logic 44' to obtain a partial page address 42' from a data queue (DQ) input/port 46. The DQ port 46 is typically used to transfer data into and out of the memory 38'. For example, in a DDR synchronous DRAM (SDRAM) read operation, two bits per clock cycle (or four bits for DDR2 SDRAM) can be fetched from the memory array (or prefetched) before being released to the DQ port 46, where the DQ port 46 outputs the data in a time multiplexed manner. The number of DQ pins depends upon the type of memory being employed. The partial page address could therefore be provided over available pins on the DQ output, or in subsequent clocks so that activation takes more clock cycles.

FIG. 3C demonstrates yet another approach in which partial page logic 44" can be used by a memory 38" to obtain a partial page address 42" from a data mask (DM) port 48. Generally, the data mask signal can be used by SDRAMs to provide byte masking during write operations, where there is one DM signal for every 8 4 bits of data width. Thus, for an x16 memory structure, the DM bits [0:1] could be used for partial page addresses. Such an approach may limit granularity, however.

Figure 4:
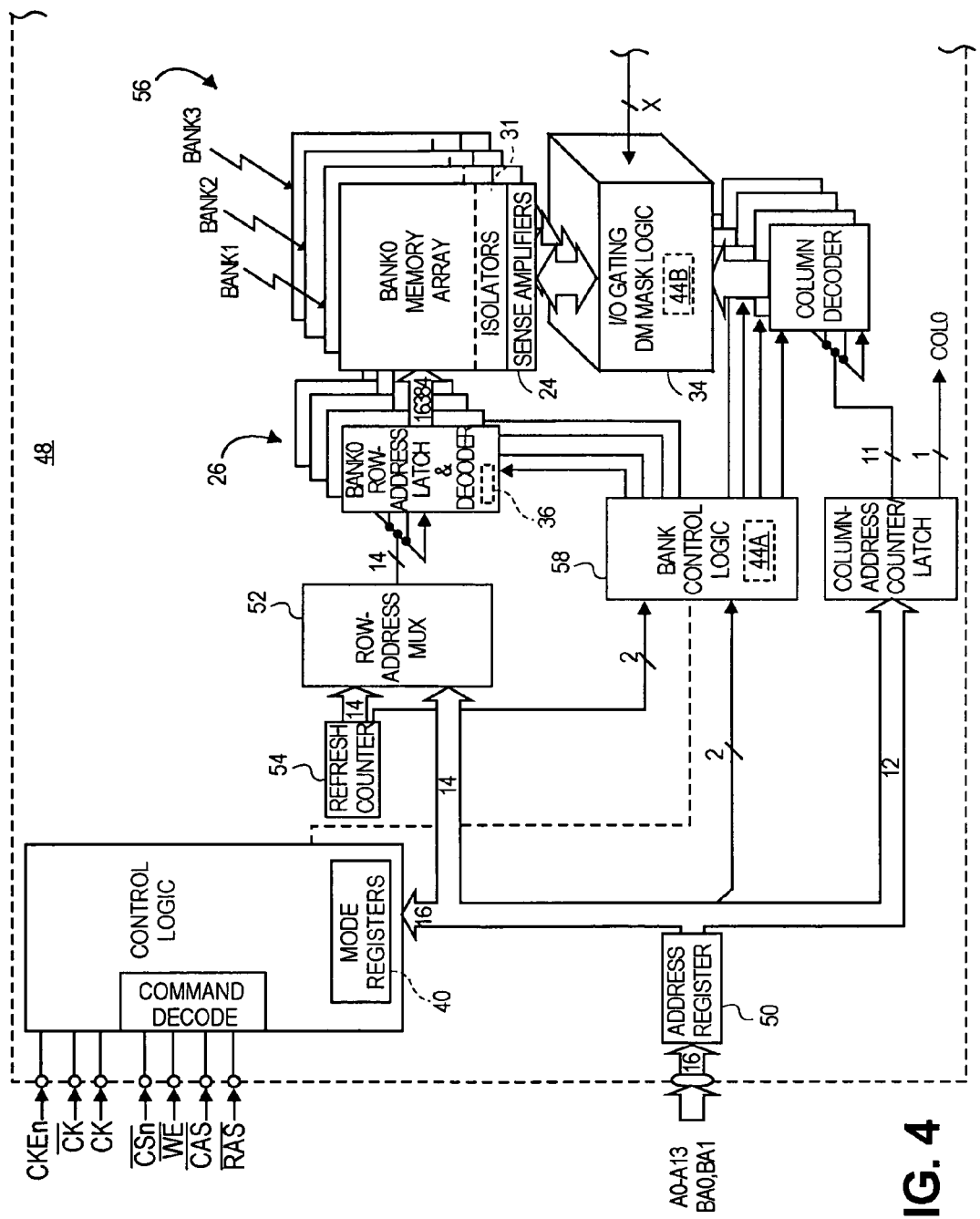
FIG. 4 is a block diagram of an example of a memory according to one or more embodiments of the invention.
Figure 4:
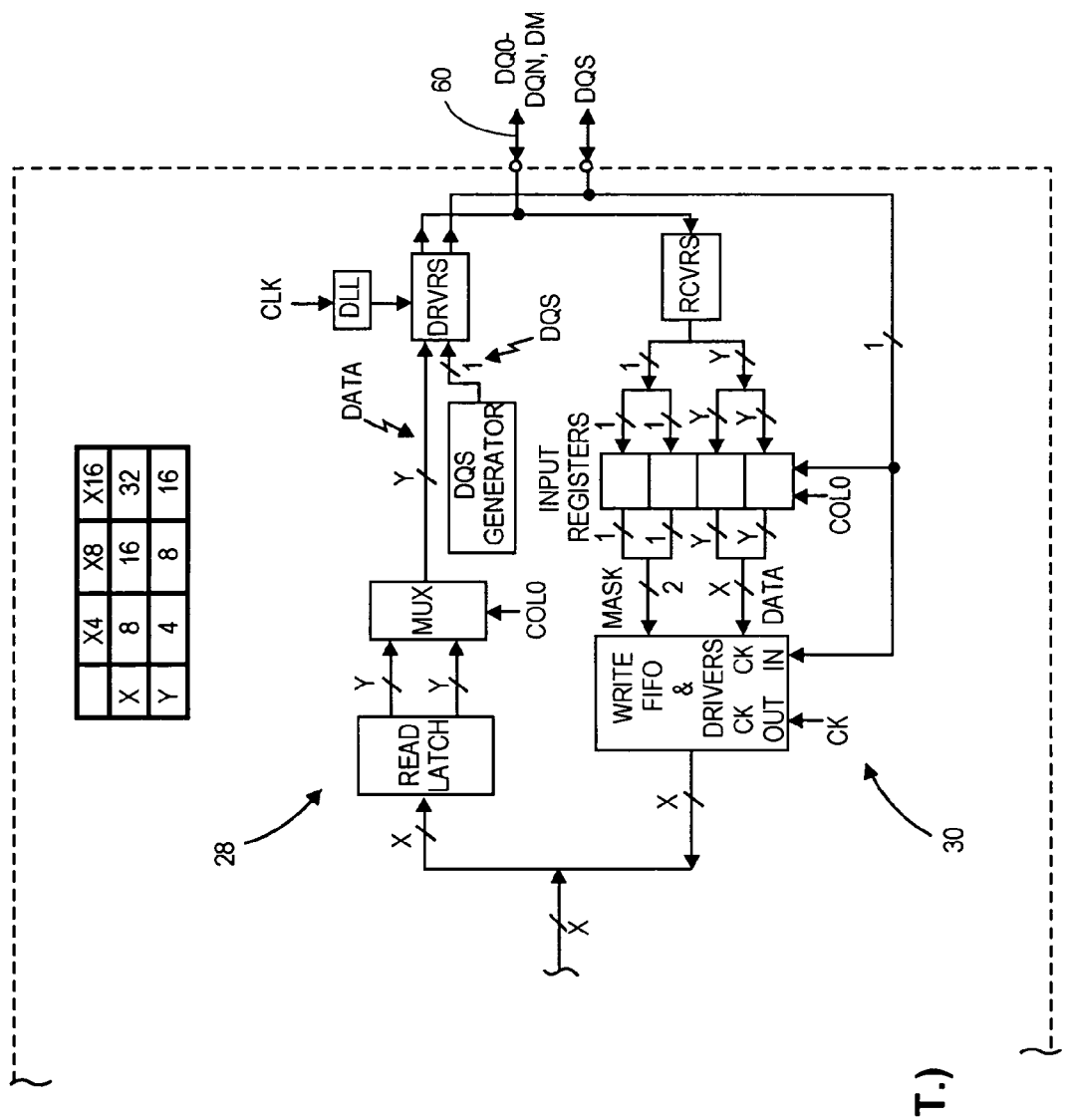

Turning now to FIG. 4, a more detailed view of a memory 48 is shown. The memory 48 can be readily substituted for any of the memories 10 (FIG. 1), 18 (FIGS. 2A and 2B), and 38 (FIGS. 3A-3C) already discussed, and is able to detect a partial page request as well as activate a partial page based on the request. The illustrated memory 48 includes an address register 50 capable of receiving a row address, and may also receive a bank identifier (e.g., BA0, BA1). A row address multiplexer 52 receives data from the address register 50 and a refresh counter 54, and feeds row address data to a set of row address decoders 26. In the illustrated example, each bank is assigned a row address decoder 26. The row address decoders 26 can latch a row select signal into a memory array 56 that is partitioned into one or more banks, where the bank selection is provided for by bank control logic 58. Each bank of the memory array 56 can include a set of rows and a set of columns, where each row/column intersection may be modeled as a capacitor that represents one bit of data. As already discussed, one more mode registers 40 can be used to identify partial page addresses, where partial page logic 44a may be disposed within the bank control logic 58 to retrieve the partial page addresses from the mode registers 40. Alternatively, a DQ/DM signal 60 may be used to identify partial page addresses, where partial page logic 44b may be disposed within the IO gating and column select logic 34, to retrieve the partial page addresses from the DQ/DM signal 60.

Similarly, a set of isolation switches 31 may provide for selection of the identified partial page address, where each isolation switch 31 can be coupled to one of the columns and one of the sense amplifiers. In such a configuration, the plurality of isolation switches 31 can isolate one or more of the sense amplifiers from one or more of the columns to obtain the partial page size. Alternatively, the row address decoders 26 can be equipped with row optimization logic 36 to exclude one or more of the plurality of columns from activation based on the requested partial page size.

Figure 5A:
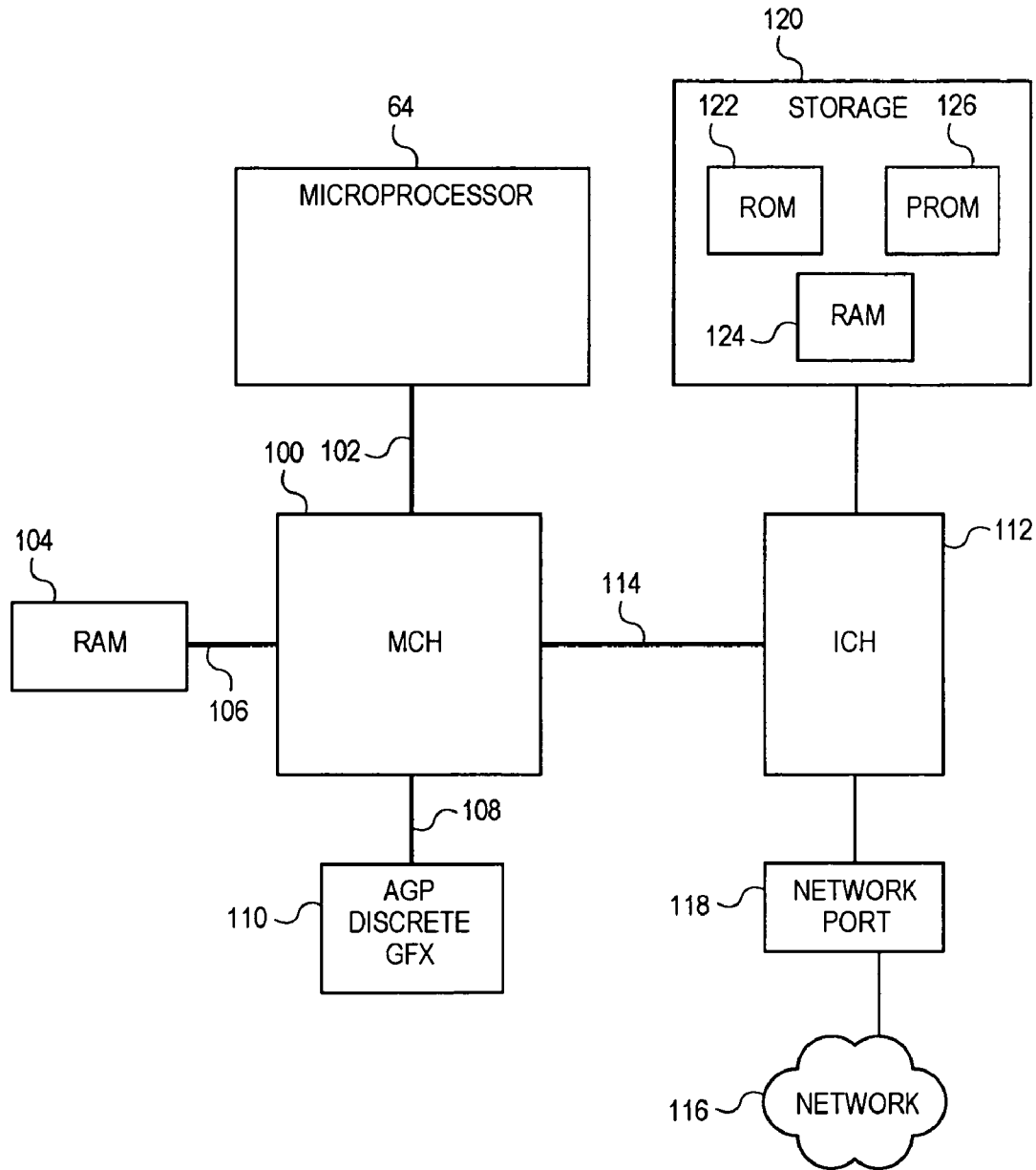
FIGS. 5A and 5B are block diagrams of examples of systems according to one or more embodiments of the invention.

Turning now to FIG. 5A, a system 66 is shown. The system 66 may include a server, desktop personal computer (PC), notebook PC, personal digital assistant (PDA), wireless "smart" phone, or any other type of computing system. The illustrated system 66 has a processor 64 that may include a reduced instruction set computer (RISC), a pipelined processor, a complex instruction set computer (CISC), and so on. Thus, the illustrated processor 64 is able to execute program code/instructions and can also include instruction fetch units, instruction decoders, execution units, etc. (not shown). Furthermore, the processor 64 may be implemented using hardware techniques such as complementary metal oxide semiconductor (CMOS) technology, controller firmware, microcode, software techniques, and any combination thereof.

The illustrated processor 64 communicates with a memory controller hub (MCH) 100, also known as a Northbridge, via a bus 102 such as a front side bus or a point-to-point fabric that interconnects all of the components in the system 66. The MCH 100 can communicate with system random access memory (RAM) 104 via a memory bus 106, where the RAM 104 may include DRAM, SDRAM, etc. The DRAM modules, which may be similar to the memories 10 (FIG. 1), 18 (FIGS. 2A and 2B), 38 (FIGS. 3A-3C), and 48 (FIG. 4), already discussed, may also be incorporated in to a single inline memory module (SIMM), dual inline memory module (DIMM), small outline DIMM (SODIMM), and so on. The MCH 100 is able to track memory accesses at the partial page level (i.e., track the partial page size of activated memory portions) and may therefore have an increased number of page-table entries. In another embodiment, the RAM 104 could fix the partial page size during system boot.

Figure 5B:
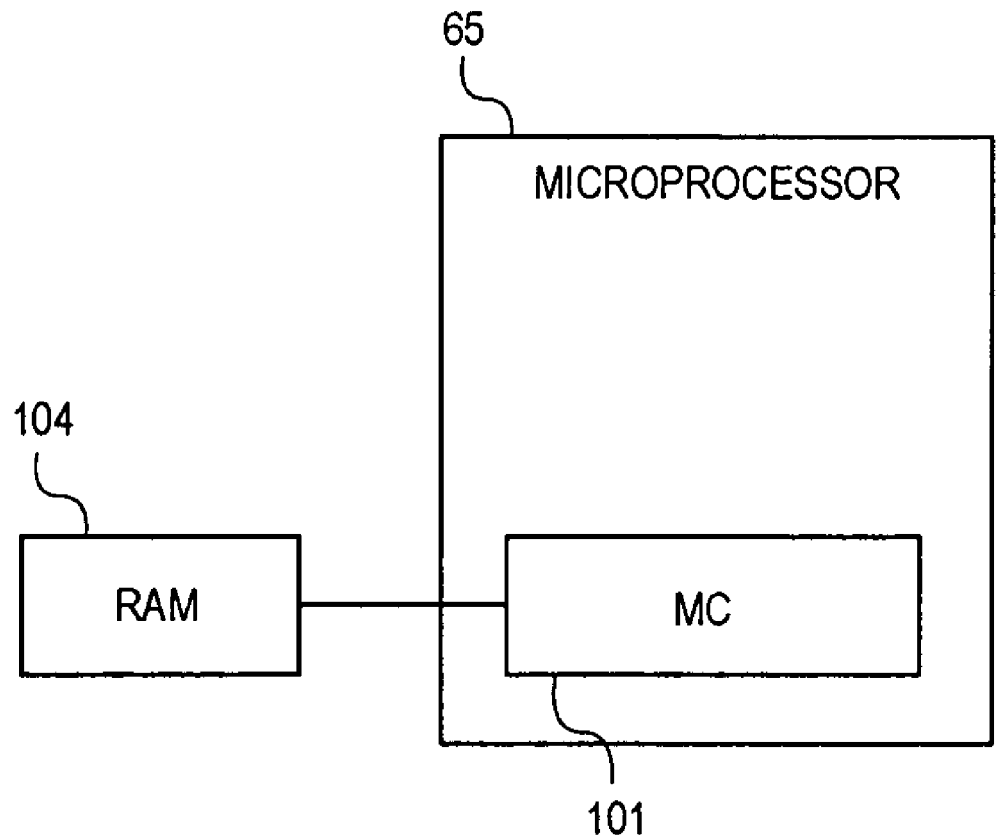

The MCH 100 can also communicate via a graphics bus 108 with an advanced graphics port (AGP) 110 to interface with an external video display unit (not shown). The illustrated MCH 100 communicates with an I/O controller hub (ICH) 112, also known as a Southbridge, via a peripheral component interconnect (PCI) bus 114. The processor 10 may also be operatively connected to a network 116 via a network port 118 through the ICH 112. The ICH may also be coupled to storage 120, which may include a read only memory (ROM) 122, RAM 124, programmable ROM (PROM) 126, flash memory, etc. FIG. 5B shows an alternative system 68 in which a memory controller 101 is included on the same die as a processor 65.

Figure 6:
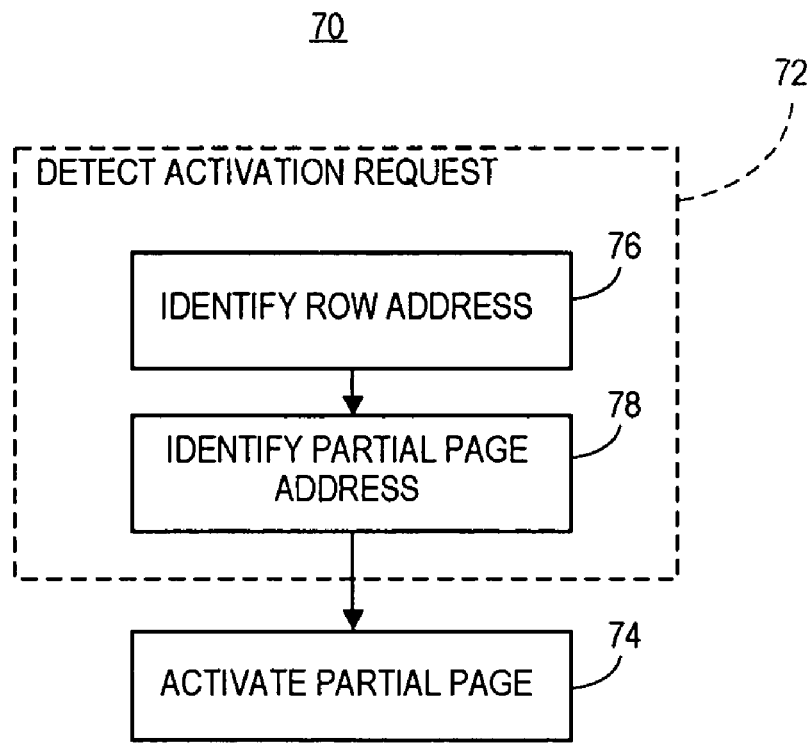
FIG. 6 is a flowchart of an example of a method of managing a memory according to one embodiment of the invention.

Turning now to FIG. 6, a method of managing a memory is shown at 70. The illustrated method 70 may be implemented, for example, using hardware, microcode or any machine-readable medium or article which may store an instruction or a set of instructions that, if executed by a machine (for example, by a multi-processing unit and/or by other suitable machines), cause the machine to perform a method and/or operations in accordance with embodiments of the invention. Such machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, various types of Digital Versatile Disks (DVDs), a tape, a cassette, or the like. The instructions may include any suitable type of code, for example, source code, compiled code, interpreted code, executable code, static code, dynamic code, or the like, and may be implemented using any suitable high-level, low-level, object-oriented, visual, compiled and/or interpreted programming language, e.g., C, C++, Java, BASIC, Pascal, Fortran, Cobol, assembly language, machine code, or the like.

In the illustrated example, processing block 72 provides for detecting a request/command to activate a memory portion that is limited in size to a partial page size, where the partial page size is less than a full page size associated with the memory. In particular, a row address associated with the activation request is identified at block 76 and a partial page address associated with the activation request is identified at block 78. As already discussed, a number of techniques may be used to identify the partial page address. For example, one approach would be to store the partial page address data to one or more mode registers, which may also be used for device configuration. Another approach would be to transmit the partial page address over available DQ pins. Yet another approach could be to transmit the partial page address over available DM pins. Block 74 provides for activating the memory portion based on the request at block 74. The activation at block 74 may also be implemented in a number of different techniques. For example, the activation could be conducted by isolating one or more sense amplifiers for the memory from one or more columns of the memory. Alternatively, partial page activation may be achieved by using a row decode circuit of the memory to exclude one or more columns of the memory from activation based on the request.

Those skilled in the art can appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. A method comprising:
   memory page logic detecting a request to activate a memory portion that is limited in size to a partial page size being a subset of a full page size associated with the memory;
   partial page logic retrieving a partial page address from a register indicating a plurality of bank columns on an activated row to be loaded into one or more sense amplifiers; and
   activating one or more switches coupled between the plurality of bank columns and the one or more sense amplifiers to isolate the one or more sense amplifiers from the bank columns to provide for activation of only the subset of the full page size.

2. The method of claim 1, wherein the activating includes using a row decode circuit of the memory to exclude at least one column of the memory from the activating based on the request.

3. The method of claim 1, wherein the detecting includes:
   identifying a row address associated with the request; and
   identifying a partial page address associated with the request, the partial page address indicating that the memory portion is to be limited to the partial page size.

4. The method of claim 3, wherein identifying the partial page address includes obtaining the partial page address from a data queue port associated with the memory.

5. The method of claim 3, wherein identifying the partial page address includes obtaining the partial page address from a data mask port associated with the memory.

6. The method of claim 1, wherein the detecting includes detecting a request to activate a dynamic random access memory.

7. The method of claim 1, further including fixing the partial page size during a boot of a system containing the memory.

8. A memory comprising:
   page logic to detect a request to activate a portion of the memory that is limited in size to a partial page size to be a subset of a full page size associated with the memory;
   a plurality of columns;

a plurality of sense amplifiers each corresponding to one of the plurality of columns;

a plurality of isolation switches each coupled to one of the columns and one of the sense amplifiers to activate only the subset of the full page size upon activation of the memory portion by isolating at least one of the sense amplifiers from at least one of the columns;

a mode register to store a partial page address indicating the plurality of columns on an activated row to be loaded into the plurality of sense amplifiers; and partial page logic to retrieve the partial page address from the mode register.

9. The memory of claim 8, further including:

a plurality of rows; and a row address decoder coupled to the plurality of rows, the row address decoder having row optimization logic to exclude at least one of the plurality of columns from activation based on the request.

10. The memory of claim 8, wherein the page logic is to identify a row address associated with the request and identify a partial page address associated with the request, the partial page address to indicate that the memory portion is to be limited to the partial page size.

11. The memory of claim 10, wherein the page logic to retrieve the partial page address from the mode register.

12. The memory of claim 10, wherein the memory includes a data queue port, the page logic to obtain the partial page address from the data queue port.

13. The memory of claim 10, wherein the memory includes a data mask port, the page logic to obtain the partial page address from the data mask port.

14. The memory of claim 8, wherein the memory is a dynamic random access memory.

15. The memory of claim 8, wherein the memory is to fix the partial page size during a boot of a system containing the memory.

16. A system comprising:

a memory having:

page logic to detect a request to activate a portion of the memory that is limited in size to a partial page size to be a subset of a full page size associated with the memory;

a plurality of columns;

a plurality of sense amplifiers each corresponding to one of the plurality of columns;

a plurality of isolation switches each coupled to one of the columns and one of the sense amplifiers to activate only the subset of the full page size upon activation of the memory portion by isolating at least one of the sense amplifiers from at least one of the columns;

a mode register to store a partial page address indicating the plurality of columns on an activated row to be loaded into the plurality of sense amplifiers; and partial page logic to retrieve the partial page address from the mode register;

a processor having a memory controller coupled to the memory to issue the request.

17. The system of claim 16, wherein the memory further includes:

a plurality of rows; and a row address decoder coupled to the plurality of rows, the row address decoder having row optimization logic to exclude at least one of the plurality of columns from activation based on the request.

18. The system of claim 16, wherein the page logic is to identify a row address associated with the request and identify a partial page address associated with the request, the partial page address to indicate that the memory portion is to be limited to the partial page size.

19. The system of claim 18, wherein the page logic to retrieve the partial page address from the mode register.

20. The system of claim 18, wherein the memory includes a data queue port, the page logic to obtain the partial page address from the data queue port.

21. The system of claim 18, wherein the memory includes a data mask port, the page logic to obtain the partial page address from the data mask port.

22. The system of claim 16, wherein the memory is a dynamic random access memory.

23. The system of claim 16, wherein the memory is to fix the partial page size during a boot of the system.

24. The system of claim 16, wherein the memory controller is to track the partial page size of the memory portion.

* * * * *